US011309618B2

(12) United States Patent
Säily et al.

(10) Patent No.: US 11,309,618 B2
(45) Date of Patent: Apr. 19, 2022

(54) ANTENNA ARRAY AND METHOD FOR MANUFACTURING THEREOF

(71) Applicant: Teknologian tutkimuskeskus VTT Oy, Espoo (FI)

(72) Inventors: Jussi Säily, Espoo (FI); Antti Lamminen, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 0 days.

(21) Appl. No.: 16/764,002

(22) PCT Filed: Oct. 8, 2018

(86) PCT No.: PCT/FI2018/050718
§ 371 (c)(1),
(2) Date: May 14, 2020

(87) PCT Pub. No.: WO2019/097109
PCT Pub. Date: May 23, 2019

(65) Prior Publication Data
US 2020/0335847 A1    Oct. 22, 2020

(30) Foreign Application Priority Data

Nov. 15, 2017  (FI) ..................... 20176018

(51) Int. Cl.
*H01Q 1/38*    (2006.01)
*H01Q 1/08*    (2006.01)
(Continued)

(52) U.S. Cl.
CPC ............... *H01Q 1/085* (2013.01); *H01Q 1/38* (2013.01); *H01Q 21/08* (2013.01); *H01Q 21/205* (2013.01); *H05K 3/4691* (2013.01)

(58) Field of Classification Search
CPC .......... H01Q 1/085; H01Q 1/38; H01Q 21/08; H01Q 21/205; H01Q 21/20;
(Continued)

(56) References Cited

U.S. PATENT DOCUMENTS 7,265,719 B1    9/2007  Moosbrugger et al.
2012/0235881 A1  9/2012  Pan et al.
(Continued)

FOREIGN PATENT DOCUMENTS

GB     2537885 A     11/2016
JP  2012029163 A     2/2012
(Continued)

*Primary Examiner* — David E Lotter
(74) *Attorney, Agent, or Firm* — Laine IP Oy

(57) ABSTRACT

According to an example aspect of the present invention, there is provided antenna array comprising: a plurality of parallel antenna elements arranged on a printed circuit board laminate comprising a flexible substrate layer on a rigid substrate layer comprising portions specific to one or more antenna elements, said flexible substrate layer comprising a feed network, wherein the rigid substrate layer is configured movable between a first arrangement of the portions of the rigid substrate layer, where the antenna array has a planar form, and a second arrangement of the portions of the rigid substrate layer, where the antenna array is curved around one or more axes.

10 Claims, 4 Drawing Sheets

(51) Int. Cl.
*H01Q 21/08* (2006.01)
*H01Q 21/20* (2006.01)
*H05K 3/46* (2006.01)

(58) Field of Classification Search
CPC .. H01Q 21/0087; H01Q 21/065; H01Q 23/00; H05K 3/4691; H05K 1/0278; H05K 1/0393; H05K 1/189
See application file for complete search history.

(56) References Cited

U.S. PATENT DOCUMENTS

| | | |
|---|---|---|
| 2013/0050015 A1 | 2/2013 | Black et al. |
| 2017/0040702 A1* | 2/2017 | West .................... H01Q 11/105 |
| 2018/0026341 A1* | 1/2018 | Mow ...................... H04B 10/90 |
| | | 343/702 |
| 2018/0294576 A1* | 10/2018 | Niakan ................ H01Q 13/103 |

FOREIGN PATENT DOCUMENTS

| | | |
|---|---|---|
| JP | 2013239902 A | 11/2013 |
| WO | WO2007130027 A1 | 11/2007 |
| WO | WO2017167875 A1 | 10/2017 |

\* cited by examiner

ANTENNA ARRAY AND METHOD FOR MANUFACTURING THEREOF

FIELD

The present invention relates to an antenna array and manufacturing an antenna array.

BACKGROUND

Wide beamwidth sector antennas are preferred in telecom base stations to reduce the number of antennas and radios. Typical sector beamwidths are 120 and 90 degrees which result in three or four sectors for full azimuth coverage. Dipole antennas are commonly used for wide beamwidth sector antennas. However, use of dipole antennas for wide beamwidth sector antennas results in a relatively high antenna volume since the dipole antennas are not planar.

SUMMARY OF THE INVENTION

The invention is defined by the features of the independent claims. Some specific embodiments are defined in the dependent claims.

According to a first aspect of the present invention, there is provided an antenna array comprising a plurality of parallel antenna elements arranged on a printed circuit board laminate comprising a flexible substrate layer on a rigid substrate layer comprising portions specific to one or more antenna elements, said flexible substrate layer comprising a feed network, wherein the rigid substrate layer is configured movable between a first arrangement of the portions of the rigid substrate layer, where the antenna array has a planar form, and a second arrangement of the portions of the rigid substrate layer, where the antenna array is curved around one or more axes.

According to a second aspect of the present invention, there is provided a method for manufacturing an antenna array, comprising:
- obtaining a printed circuit board laminate comprising flexible substrate layer comprising a feed network attached on a rigid substrate layer;
- dividing the rigid substrate layer into portions specific to one or more antenna elements such that the antenna elements are configured movable between a first arrangement of the portions of the rigid substrate layer, where the antenna array has a planar form, and a second arrangement of the portions of the rigid substrate layer, where the antenna array is curved around one or more axes;
- installing one or more active or passive electrical components on the flexible substrate layer for feeding at least one of radio frequency signals, control signals and voltage for the antenna elements.

EMBODIMENTS

There is provided an antenna array comprising a plurality of parallel antenna elements arranged on a printed circuit board laminate. The flexible substrate layer comprises a feed network for the antenna elements. The rigid substrate layer comprises portions specific to one or more antenna elements and the rigid substrate layer is configured movable between a first arrangement of the portions of the rigid substrate layer, where the antenna array has a planar form, and a second arrangement of the portions of the rigid substrate layer, where the antenna array is curved around one or more axes. In this way the antenna may be conformed to various forms to facilitate obtaining a wide beamwidth for the antenna array, when the antenna array is installed to its installation location for performing radio communications, as well as to facilitate manufacturing, storage and/or transportation of the antenna array.

Figure 1:
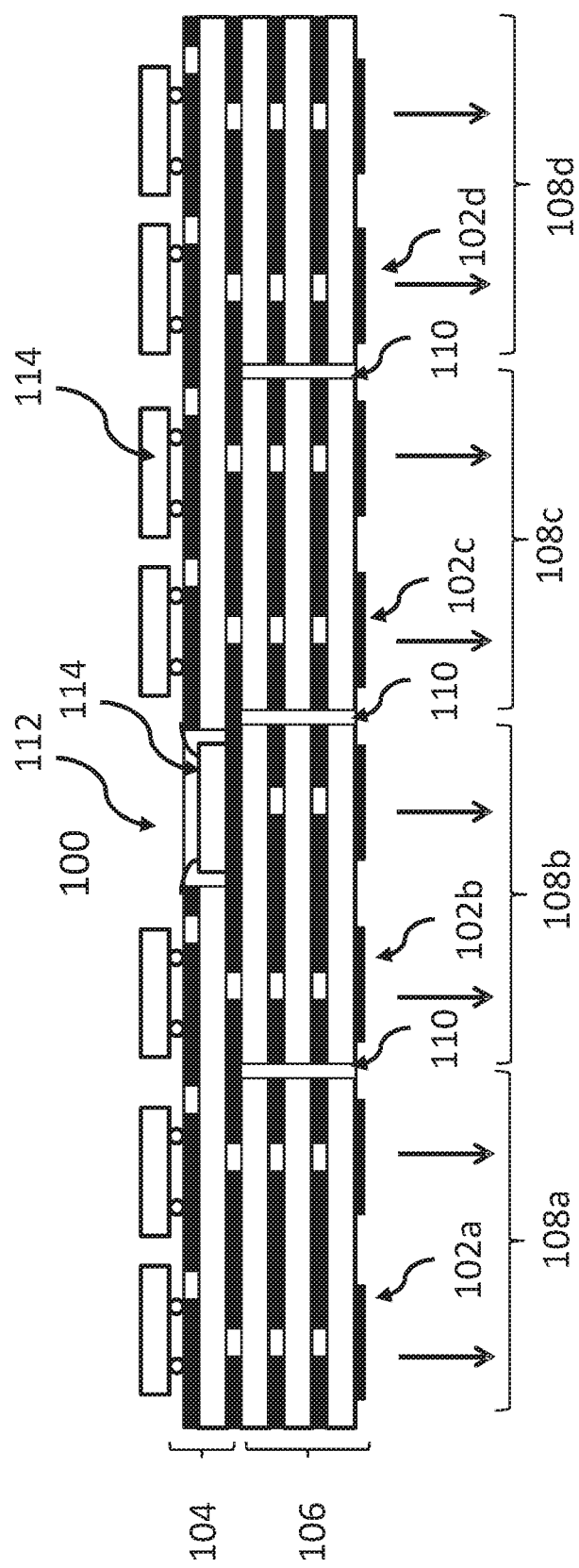
FIGS. 1 and 2 illustrate antenna arrays in accordance with at least some embodiments of the present invention.
Figure 2:
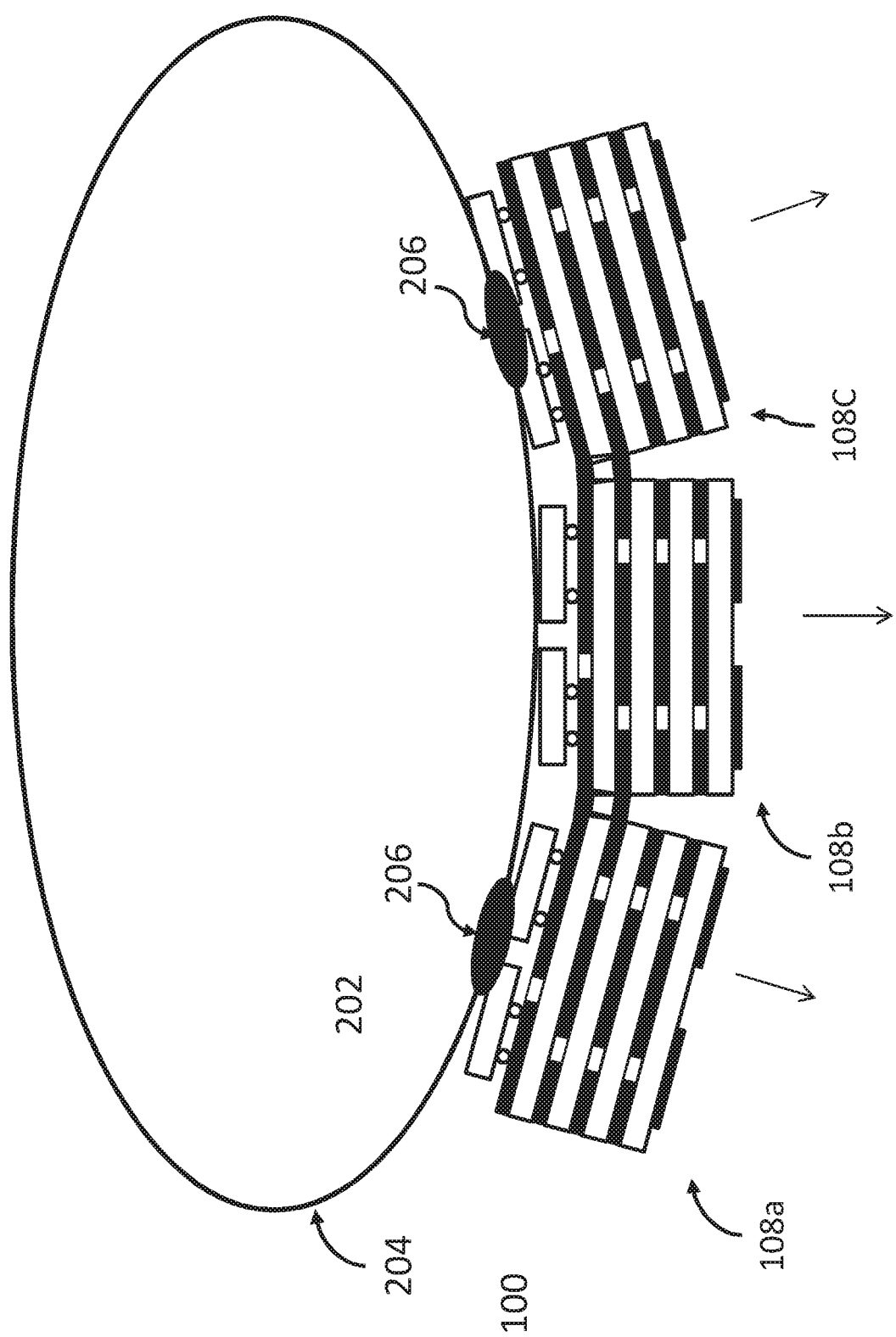

Referring to FIGS. 1 and 2 an antenna array 100 comprises a plurality of parallel antenna elements 102a, 102b, 102c, 102d, arranged on a printed circuit board (PCB) laminate. The PCB laminate comprises a flexible substrate layer 104 on a rigid substrate layer 106. The rigid substrate layer comprises portions 108a, 108b, 108c, 108d, specific to one or more antenna elements. The flexible substrate layer comprises a feed network. The rigid substrate layer is configured movable between a first arrangement of the portions of the rigid substrate layer, where the antenna array has a planar form, and a second arrangement of the portions of the rigid substrate layer, where the antenna array is curved around one or more axes. The various arrangements of the portions of the rigid substrate layer provide that the antenna array may be conformed such that, when the antenna array is installed to its installation location for performing radio communications, the antenna array may have a wide beamwidth as well as be easily attached to installation surface at the installation location. The beamwidth of the antenna array may be defined in radiation directions of the antenna elements, illustrated by direct arrows in FIGS. 1 and 2. Additionally, various applications, e.g. manufacturing, storage and/or transportation, of the antenna array may be facilitated, since the antenna array may have at least one arrangement of the portions of the rigid substrate layer for each application. Accordingly, it is viable that the antenna array may have dedicated arrangements of the portions of the rigid substrate layer for each application and/or some of the applications have the same arrangements of the portions of the rigid substrate layer. For example, during manufacturing, storage and/or transportation of the antenna array, the arrangement of the portions of the rigid substrate layer, where the antenna array has a planar form, may be preferred, whereas the arrangement of the portions of the rigid substrate layer, where the antenna array is curved around one or more axes, may be preferred, when the antenna array is installed to a wide beamwidth antenna array.

Examples of arrangements of the portions of the rigid substrate layer comprise planar form of the antenna array and a curved form of the antenna array. In the curved form of the antenna array, the antenna array may be curved around one or more axes. Further examples of the arrangements of the portions of the rigid substrate layer comprise various levels of curvatures as well as one or more directions of the curvature comprising concave and convex curvatures. Accordingly, the antenna array may be curved around one or more axes, whereby the antenna array may be concave or convex in one or more planes.

An antenna element may be capable of transmitting and/or receiving a radio frequency signal. Transmitting a radio frequency signal may comprise receiving a radio frequency signal from a transmitter and transmitting the radio frequency signal as radio waves in a radiation direction of the antenna element. Receiving a radio frequency signal may comprise receiving radio waves (essentially) from the radiation direction, forming a radio frequency signal from the received radio waves and supplying the formed radio frequency signal to a receiver. The antenna element may have radiator surface for transmission/reception of the radio waves in the radiation direction. The radiation direction may at least partially define a radiation pattern of the antenna element. Accordingly, a radiation pattern may be a sector in the radiation direction. The sector may be a beam that has a horizontal beamwidth, e.g. 60 deg, 90 deg or 120 deg, and a vertical beamwidth, e.g. 15 deg. Radiation pattern of the antenna array may be defined, for example as combination, on the basis of radiation patterns of the antenna elements.

In an embodiment, the antenna array is a wide beamwidth sector antenna or an omnidirectional antenna. Accordingly, when the antenna array is installed, radiation pattern of the antenna array may be defined by radiation patterns of the antenna elements such that a wide beamwidth antenna or an omnidirectional antenna may be obtained. The radiation pattern may be defined at least in one plane such as in azimuth plane of a spherical coordinate system fixed to the antenna array. It should be appreciated that since the rigid substrate layer may be moved between different arrangements of the portions of the rigid substrate layer, the antenna array may provide several, for example, 120 deg, 90 deg or 60 deg coverage antenna, sectors including integrated circuits on the same PCB to facilitate 360 deg coverage.

In an embodiment, the antenna array may be capable of 360 deg scanning. Accordingly, antenna elements of the antenna array may provide sectors, for example 120 deg, 90 deg or 60 deg antenna sectors, whereby three, four or six antenna elements may be sufficient for the antenna array to have 360 deg coverage, when the antenna array is installed. Accordingly, when the antenna array is installed, the portions of the rigid substrate layer are curved around an axis and the antenna sectors provide the 360 deg coverage. Then, components installed on the flexible substrate layer may control the antenna elements to perform the 360 deg scanning by pointing and phasing the antenna elements arranged on different portions of the rigid substrate layer. Tilting the phased antenna array columns may result in lower scan loss than with conventional array phasing method.

In an embodiment, the antenna array is a millimeter wave antenna array. The short wavelength allows modest size antenna elements, whereby installation of the antenna array to various locations may be facilitated to provide improved radio communications coverage in communications networks.

FIG. 1 illustrates an antenna array having a planar form. The planar form may be preferred for example prior to installation of the antenna array. Prior to installation of the antenna array, the antenna array may have been manufactured and stored in a warehouse or vehicle, for example.

FIG. 2 illustrates an antenna array curved around an axis. The axis may be formed by a physical structure 202. On the other hand the axis may be a logical center point of curvature of the antenna array. Examples of physical structures for forming an axis comprise infrastructure, for example a light pole, that is present in a planned coverage are of the antenna array. A light pole may a raised source of light such as a street light, light pole, lamppost, street lamp, light standard, or lamp standard on the edge of a road or path. The physical structure may comprise a surface 204 on which a large portion of the antenna array may be positioned to be supported by the surface. Accordingly, a raised source of light such as the light pole may have a pole, pole like or other elongated structure capable of supporting a light source above the ground, when installed to a location on the ground. The antenna array may be installed to a surface of the pole, pole like or other elongated structure that forms an axis around which the antenna array is curved. The antenna array may be attached to the surface by attaching means 206 such chemical or mechanical attaching means. Examples of the chemical attaching means comprise adhesives. Examples of the mechanical attaching means comprise nuts and bolts.

In an embodiment, the antenna array may comprise antenna elements 102a, 102b, 102c, 102d that are connected to one or more neighboring antenna elements by the flexible substrate layer 104 and the portions of the rigid substrate layer 108a, 10b, 108c, 108d are separated by spacers or grooves 110 that provide moving the antenna elements between the arrangements of portions of the rigid substrate layer. Examples of the spacers and grooves comprise milled breakout tabs, V-score grooves, thin rigid bridges or similar structures. The spacers or grooves provide means for separating the antenna elements such that the portions of the rigid substrate layer may be moved to different arrangements. In one example, the antenna elements are separated by thin rigid bridges of the rigid substrate material. The thin rigid bridges may be bent for moving the antenna elements between the different arrangements. The thin rigid bridges may maintain the antenna elements in at least one of the arrangements. It is viable that the thin rigid bridges may be broken by exerting sufficient force thereto. In this way the portions of the rigid substrate layer may be disconnected from each other at the rigid substrate layer but still be connected by the flexible substrate. Once the thin rigid bridges may have been broken, the antenna elements may be moved guided by the flexible substrate layer.

In an embodiment, the flexible substrate layer 104 and the rigid substrate layer 106 are made of low-loss substrates, the rigid substrate layer comprises fiber glass reinforced material and the flexible substrate layer is attached to the rigid substrate layer. In this way the antenna elements may be fed in different arrangements of the portions of the rigid substrate layers by the feed network. The flexible substrate layer may be laminated on the rigid substrate layer, whereby the movement between the arrangements may be guided by the flexible substrate layer. The flexible substrate layer may comprise polyimide or liquid crystal polymer (LCP).

In an embodiment, the flexible substrate layer 104 comprises one or more cavities 112 for connecting active or passive electrical components 114 directly to the rigid substrate layer under the flexible substrate layer. In this way electrical components that are specific to an antenna element may be connected directly to the rigid substrate without the flexible substrate between the components and the antenna element.

In an embodiment, the flexible substrate layer 104 provides at least one of feeding radio frequency signals, control signals and voltage for the antenna elements 102a, 102b, 102c, 102d and associated active or passive electrical circuits such as phase shifters, amplifiers or switches. In this way the flexible substrate layer may serve for feeding the radio frequency signals, control signals and voltage between the components and the antenna elements.

In an embodiment, a ground plane is arranged on the flexible layer for isolating the feed network from the rigid layer. In this way the portions of the rigid substrate layer are connected by the feed network and ground plane of the flexible layer. In an example, the antenna elements are aperture-coupled antennas and the ground plane may comprise apertures for feeding radio frequency signal from the feed network to the antenna elements. However, it should be appreciated that the antenna feed may be arranged also in other ways, for example using a coupled feed, probe feed or insert feed.

Figure 3:
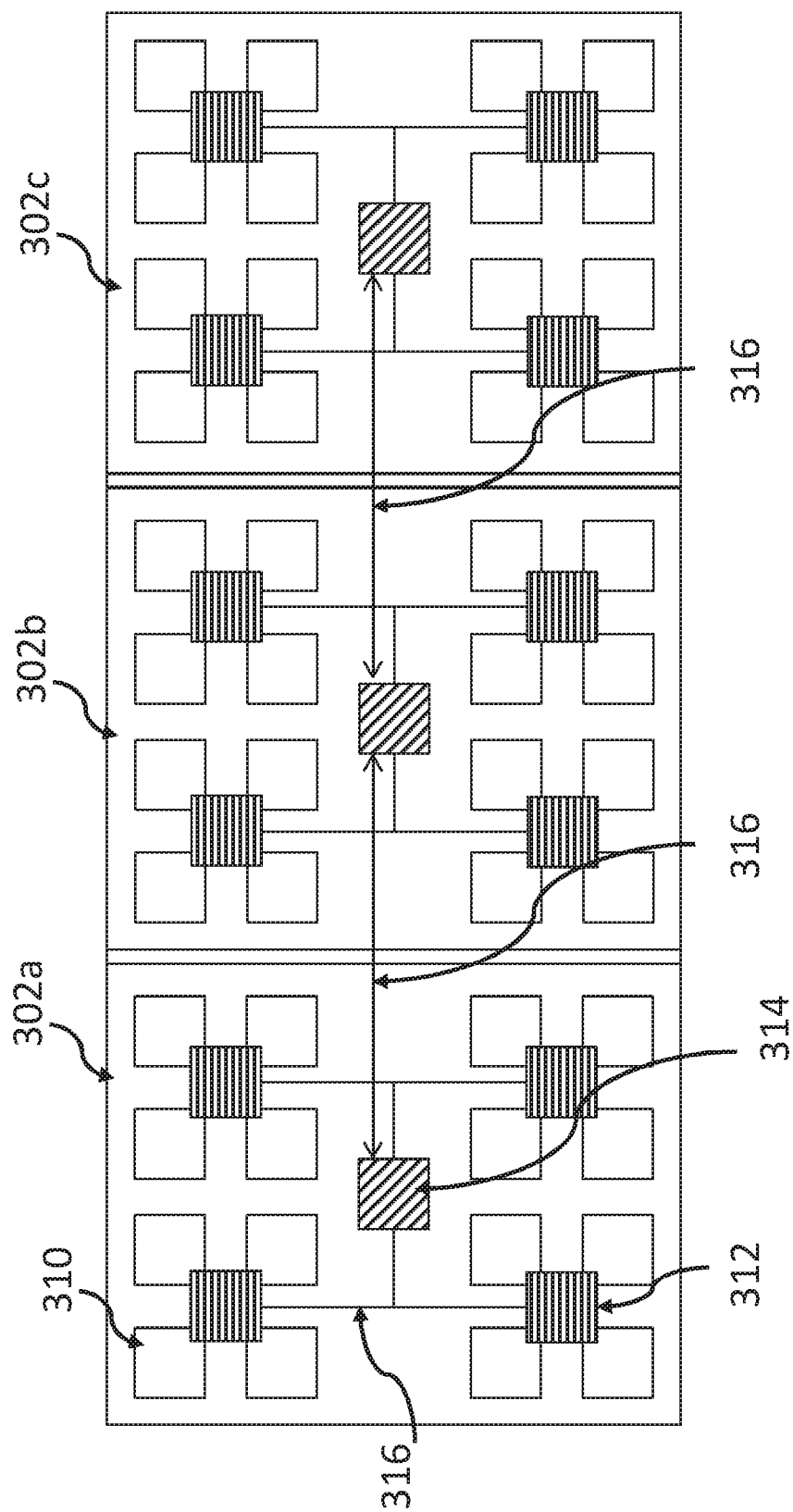
FIG. 3 illustrates antenna arrays in accordance with at least some embodiments.

FIG. 3 illustrates antenna arrays in accordance with at least some embodiments. The antenna arrays 302a, 302b, 302c may be in accordance with the antenna arrays described with FIGS. 1 and 2. The antenna arrays may be arranged on the same PCB laminate comprising a flexible substrate layer on a rigid substrate layer comprising portions specific to one or more antenna elements 310 of the antenna arrays. Accordingly, each of the antenna arrays may be connected to one or more adjacent antenna arrays by the flexible substrate layer. The flexible substrate layer comprises a feed network, wherein the rigid substrate layer is configured movable between a first arrangement of the portions of the rigid substrate layer, where the antenna arrays have a planar form, and a second arrangement of the portions of the rigid substrate layer, where the antenna arrays are curved around one or more axes. In this way several antenna arrays may be conformed to various forms to facilitate obtaining a wide beamwidth for the several antenna arrays, when the antenna arrays are installed to their installation location for performing radio communications, as well as to facilitate manufacturing, storage and/or transportation of the antenna arrays. Since the portions of the rigid substrate layer may belong to antenna elements of adjacent antenna arrays, different arrangements of the portions of the rigid substrate layer provide various forms of the adjacent antenna arrays in accordance with the forms described above for a single antenna array.

The antenna arrays 302a, 302b, 302c may comprise active or passive electrical components such as phase shifters, amplifiers or switches. The electrical components may be specific to one or more antenna elements 304 or specific to an antenna array. A component 312 specific to one or more antenna elements is configured to serve that antenna element. The flexible substrate layer may comprise one or more cavities for connecting an antenna element specific component directly to a portion of the rigid substrate layer of the antenna element. Examples of cavities comprise a hole, a slot, a puncture, a perforation, a cavity, an eye. A component 314 that is specific to an antenna array is configured to serve that antenna array. The components may be connected to the feed network 316 for feeding at least one of radio frequency signals, control signals and voltage for the antenna elements located in the same antenna array and/or in different antenna arrays.

Figure 4:
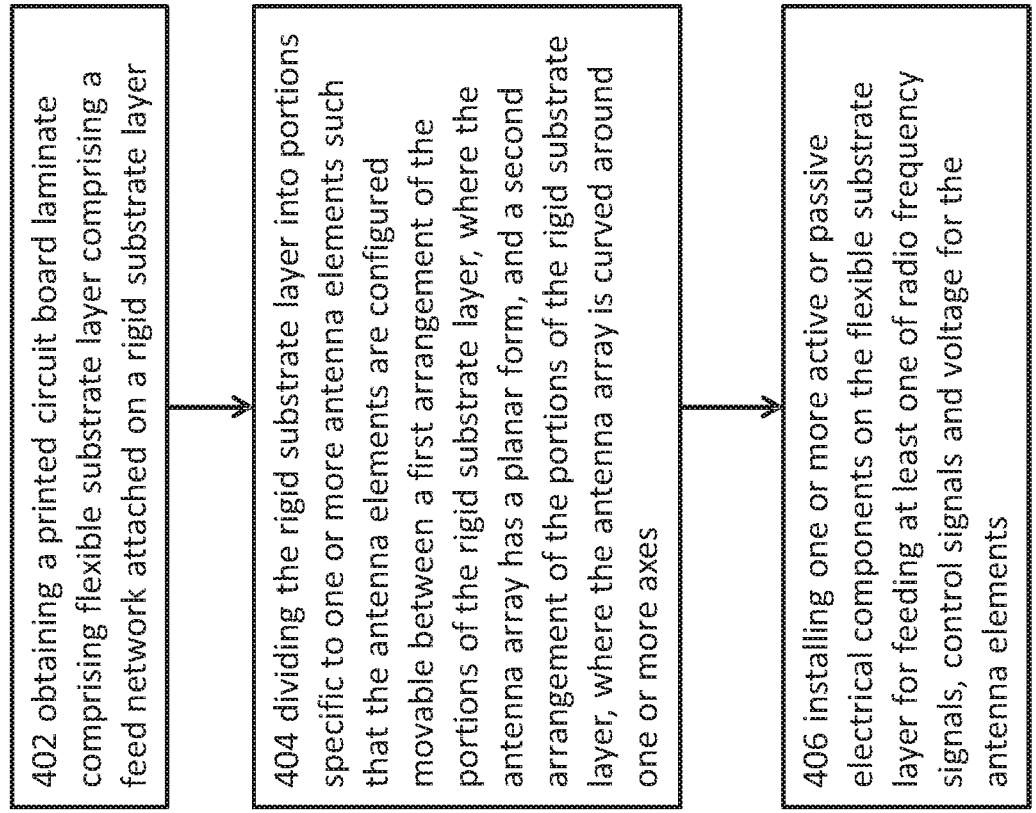
FIG. 4 illustrates a method for manufacturing an antenna array, in accordance with at least some embodiments of the present invention.

FIG. 4 illustrates an example method for manufacturing an antenna array in accordance with at least some embodiments of the present invention. Phase 402 of the method comprises obtaining a printed circuit board laminate comprising flexible substrate layer comprising a feed network attached on a rigid substrate layer. Phase 404 of the method comprises dividing the rigid substrate layer into one or more portions specific to one or more antenna elements such that the antenna elements are configured movable between a first arrangement of the portions of the rigid substrate layer, where the antenna array has a planar form, and a second arrangement of the portions of the rigid substrate layer, where the antenna array is curved around one or more axes. Phase 406 of the method comprises installing one or more active or passive electrical components on the flexible substrate layer for feeding at least one of radio frequency signals, control signals and voltage for the antenna elements.

Preferably, the electrical components are installed to the flexible substrate layer, when the antenna elements are in the first arrangement, where the antenna array has a planar form for facilitating the installation.

In an embodiment, the method further comprises dividing the rigid substrate layer into the portions by milling the rigid substrate layer between the portions of the rigid substrate layer 108a, 10b, 108c, 108d. Milling the rigid substrate layer provides spacers or grooves, whereby the antenna elements may be moved, e.g. by bending or twisting, between arrangements of portions of the rigid substrate layer. In this way the antenna array may be brought into a desired form for example planar form, curved form around one or more axes. Examples of the spacers and grooves comprise milled breakout tabs, V-score grooves, thin rigid bridges or similar.

In an embodiment, the flexible substrate layer may comprise cavities such that active or passive electrical components may be directly connected to the rigid substrate layer under the flexible substrate layer. Accordingly, the method may comprise perforating the cavities to the flexible substrate layer or the cavities may be pre-formed to the flexible substrate layer. Examples of cavities comprise a hole, a slot, a puncture, a perforation, a cavity, an eye.

In an example, the milling depth may be controlled for providing the rigid substrate with thin rigid bridges to ease component assembly. The bridges may then be snapped when the antenna array is conformed to an installation position.

It should be appreciated that a portion of rigid substrate layer may comprise one or more antenna elements arranged for example in a column. The portions of the rigid substrate layer may be symmetrical or non-symmetrical blocks separated from neighboring blocks by spacers or grooves between the antenna elements and antenna arrays.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the above description numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

INDUSTRIAL APPLICABILITY

Antenna arrays and corresponding methods described herein may be utilized for enabling radio communications between communications devices. The radio communications may comprise communications between a user device, for example a smart phone, and a base station of a communications network. Examples of the communications networks comprise IEEE 802.11 based Wireless Local Area Networks, 4G and 5G networks. The antenna arrays may be connected to base stations for radio communications, e.g. transmitting and/or receiving radio signals, via the antenna array. The antenna arrays may be utilized at least in base station deployments where wide or omnidirectional sector coverage is appreciated. The antenna arrays may be utilized in active antennas such as phased antenna arrays and switched beam antenna arrays, and also in passive antennas.

REFERENCE SIGNS LIST 102a, 102b, 102c, 102d Antenna elements
104 Flexible substrate layer
106 Rigid substrate layer
108a, 108b, 108c, 108d Portions of rigid substrate layer
110 Groove
112 Cavity
114 Electrical component
202 Physical structure
204 Surface
206 Attaching means
302a, 302b, 302c Antenna arrays
310 Antenna element
312 A component specific to one or more antenna elements
314 A component specific to an antenna array
316 Feed network
402, 404, 406 Phases of the method of FIG. 4

The invention claimed is:

1. An antenna array comprising:
a plurality of parallel radiating antenna elements arranged on a printed circuit board laminate comprising a flexible substrate layer on a rigid substrate layer comprising portions specific to one or more radiating antenna elements, said flexible substrate layer comprising a feed network, wherein the rigid substrate layer is configured movable between a first arrangement of the portions of the rigid substrate layer, where the radiating antenna elements are coplanar, and a second arrangement of the portions of the rigid substrate layer, where at least two of the radiating antenna elements are non-planar with respect to each other, and wherein the radiating antenna elements are connected to one or more neighboring antenna elements by the flexible substrate and the portions of the rigid substrate layer are separated by spacers or grooves between at least some adjacent radiating antenna elements that provide moving said adjacent radiating antenna elements between the arrangements.

2. The antenna array according to claim 1, wherein the flexible substrate layer and the rigid substrate layer are low-loss substrates, the rigid substrate layer comprises fiber glass reinforced material and the flexible substrate layer is attached to the rigid substrate layer.

3. The antenna array according to claim 1, wherein the flexible substrate comprises one or more cavities for connecting components directly to the rigid substrate layer under the flexible substrate layer.

4. The antenna array according to claim 1, wherein at least one arrangement of the portions of the rigid substrate layer comprises that the antenna array is concave or convex in one or more planes.

5. The antenna array according to claim 1, wherein the antenna array is a wide beamwidth sector antenna or an omnidirectional antenna.

6. The antenna array according to claim 1, wherein the antenna array is a millimeter wave antenna array.

7. The antenna array according to claim 1, wherein the flexible substrate layer provides at least one of feeding radio frequency signals, control signals and voltage for the antenna elements and associated active or passive electrical components such as phase shifters, amplifiers or switches.

8. The antenna array according to claim 1, wherein a ground plane is arranged on the flexible layer for isolating the feed network from the rigid layer.

9. A method for manufacturing an antenna array, comprising:
obtaining a printed circuit board laminate comprising a flexible substrate layer comprising a feed network attached on a rigid substrate layer;
dividing the rigid substrate layer into portions specific to one or more radiating antenna elements such that the radiating antenna elements are configured movable between a first arrangement of the portions of the rigid substrate layer, where the radiating antenna elements are coplanar, and a second arrangement of the portions of the rigid substrate layer, where at least two of the radiating antenna elements are non-planar with respect to each other and wherein the radiating antenna elements are connected to one or more neighboring antenna elements by the flexible substrate and the portions of the rigid substrate layer are separated by spacers or grooves between at least some adjacent radiating antenna elements that provide moving said adjacent radiating antenna elements between the arrangements; and
installing one or more active or passive electrical components on the flexible substrate layer for feeding at least one of radio frequency signals, control signals and voltage for the antenna elements.

10. The method for manufacturing an antenna array according to claim 9, further comprising forming the spacers or grooves by milling the rigid substrate layer between the antenna elements.

* * * * *